US010833616B1

(12) United States Patent
Silverstein et al.

(10) Patent No.: US 10,833,616 B1
(45) Date of Patent: Nov. 10, 2020

(54) GAS TURBINE ENGINE GENERATOR POWER MANAGEMENT CONTROL SYSTEM

(71) Applicant: Rolls-Royce Marine North America Inc., Walpole, MA (US)

(72) Inventors: Donald Silverstein, Indianapolis, IN (US); Ainsmar Brown, Indianapolis, IN (US); Ivan Troitsky, Indianapolis, IN (US); James Greg Steinrock, Columbus, IN (US)

(73) Assignee: Rolls-Royce Marine North America Inc., Walpole, MA (US)

( * ) Notice: Subject to any disclaimer, the term of this patent is extended or adjusted under 35 U.S.C. 154(b) by 0 days.

(21) Appl. No.: 16/692,213

(22) Filed: Nov. 22, 2019

(51) Int. Cl.
*H02P 9/00* (2006.01)
*H03H 21/00* (2006.01)
*H02P 101/35* (2016.01)
*H02P 101/30* (2015.01)
*H02P 101/25* (2016.01)

(52) U.S. Cl.
CPC ......... *H02P 9/008* (2013.01); *H03H 21/0043* (2013.01); *H02P 2101/25* (2015.01); *H02P 2101/30* (2015.01); *H02P 2101/35* (2015.01)

(58) Field of Classification Search
CPC .. H02P 9/008; H02P 2101/30; H02P 2101/25; H02P 2101/35; H03H 21/0043
See application file for complete search history.

(56) References Cited

U.S. PATENT DOCUMENTS 2,627,597 A * 2/1953 Johansson ................ B60L 7/04
318/365
4,455,614 A * 6/1984 Martz .................... F01K 23/10
290/40 R (Continued)

FOREIGN PATENT DOCUMENTS

| CA | 2 318 944 C | 9/2007 |
| CN | 104753402 A | 7/2015 |
| RU | 2007-103196 A | 8/2008 |

OTHER PUBLICATIONS

Choe, J-M, et. al., "System for Load Leveling Control and Operation of an Energy Storage System", dated Mar. 2, 2017, pp. 739-745, vol. 10, Iss. 7, IET Power Electron., 2017.

(Continued)

*Primary Examiner* — Tulsidas C Patel
*Assistant Examiner* — Joseph Ortega
(74) *Attorney, Agent, or Firm* — Brinks Gilson & Lione

(57) ABSTRACT

A power management system may include an energy source and a generator driven by a gas turbine engine to output generator power to a common bus. A source power converter is electrically coupled between the energy source and the common bus. A controller circuitry includes an adaptive filter to filter a power signal indicative of power consumption of a variable load on the common bus, and outputs a filtered signal as a load demand signal to the generator. A source demand error signal is also output to control the source power converter to supply power from the energy source to the common bus. The controller circuitry is further configured to automatically adjust the adaptive low pass filter in accordance with the power consumption of the dynamic load and the load demand signal of the generator.

20 Claims, 11 Drawing Sheets

(56) References Cited

U.S. PATENT DOCUMENTS

| | | | | |
|---|---|---|---|---|
| 5,404,092 A * | 4/1995 | Gegner | ............... | H02M 1/4208 |
| | | | | 323/207 |
| 5,563,802 A * | 10/1996 | Plahn | ............... | H02J 9/062 |
| | | | | 290/1 R |
| 5,808,879 A * | 9/1998 | Liu | ............... | H02M 3/337 |
| | | | | 323/222 |
| 5,896,736 A * | 4/1999 | Rajamani | ............... | F02C 9/20 |
| | | | | 60/773 |
| 6,175,217 B1 * | 1/2001 | Da Ponte | ............... | H02J 9/066 |
| | | | | 322/19 |
| 6,367,570 B1 * | 4/2002 | Long, III | ............... | B60K 6/485 |
| | | | | 180/65.26 |
| 6,512,305 B1 * | 1/2003 | Pinkerton | ............... | H02J 9/066 |
| | | | | 290/1 A |
| 6,784,565 B2 * | 8/2004 | Wall | ............... | H02J 1/10 |
| | | | | 290/52 |
| 6,812,586 B2 * | 11/2004 | Wacknov | ............... | H02P 9/04 |
| | | | | 290/40 B |
| 6,900,556 B2 * | 5/2005 | Provanzana | ............... | H02J 3/28 |
| | | | | 307/19 |
| 6,958,550 B2 * | 10/2005 | Gilbreth | ............... | H02J 1/10 |
| | | | | 290/2 |
| 7,012,392 B2 * | 3/2006 | Nguyen | ............... | H02P 3/12 |
| | | | | 318/371 |
| 7,092,262 B2 * | 8/2006 | Ryan | ............... | H02M 7/062 |
| | | | | 323/207 |
| 8,179,703 B2 * | 5/2012 | Uno | ............... | H02M 1/4225 |
| | | | | 363/44 |
| 8,314,578 B2 * | 11/2012 | Namuduri | ............... | H02P 27/06 |
| | | | | 318/400.3 |
| RE43,956 E * | 2/2013 | King | ............... | H02J 7/0024 |
| | | | | 307/10.1 |
| 8,659,185 B2 * | 2/2014 | Coons | ............... | H02J 1/10 |
| | | | | 307/44 |
| 8,786,264 B2 * | 7/2014 | Muhammad | ............... | H02M 3/1584 |
| | | | | 323/272 |
| 8,803,458 B2 * | 8/2014 | Horikoshi | ............... | H02P 3/22 |
| | | | | 318/400.29 |
| 8,803,499 B2 * | 8/2014 | Sreenivas | ............... | H02M 3/1588 |
| | | | | 323/284 |
| 8,963,520 B1 * | 2/2015 | Leone | ............... | G05F 1/468 |
| | | | | 323/271 |
| 9,087,656 B1 * | 7/2015 | Vinciarelli | ............... | H02M 1/4258 |
| 9,175,605 B2 * | 11/2015 | Bowman | ............... | F02C 6/08 |
| 9,236,804 B2 * | 1/2016 | Pal | ............... | H02M 3/33515 |
| 10,050,433 B2 * | 8/2018 | Panosyan | ............... | H02J 3/381 |
| 10,263,552 B2 * | 4/2019 | Noderer | ............... | H02P 29/0016 |
| 10,401,885 B2 * | 9/2019 | Bollman | ............... | H02M 3/07 |
| 2004/0145188 A1 * | 7/2004 | Janssen | ............... | H02J 3/386 |
| | | | | 290/44 |
| 2004/0245783 A1 * | 12/2004 | Gilbreth | ............... | H02J 1/10 |
| | | | | 290/52 |
| 2005/0030772 A1 * | 2/2005 | Phadke | ............... | H02M 3/28 |
| | | | | 363/71 |
| 2005/0285554 A1 * | 12/2005 | King | ............... | B60L 50/60 |
| | | | | 318/376 |
| 2006/0220387 A1 * | 10/2006 | Tsuzuki | ............... | H02P 9/04 |
| | | | | 290/52 |
| 2007/0051233 A1 * | 3/2007 | Duge | ............... | F41H 13/00 |
| | | | | 89/1.13 |
| 2007/0100506 A1 * | 5/2007 | Teichmann | ............... | H02J 3/382 |
| | | | | 700/297 |
| 2007/0121354 A1 * | 5/2007 | Jones | ............... | H02P 9/102 |
| | | | | 363/47 |
| 2009/0312885 A1 * | 12/2009 | Buiel | ............... | H02J 3/32 |
| | | | | 700/297 |
| 2010/0270864 A1 * | 10/2010 | Vyas | ............... | H02J 7/35 |
| | | | | 307/82 |
| 2012/0211980 A1 * | 8/2012 | Desabhatla | ............... | F02N 11/04 |
| | | | | 290/31 |
| 2014/0103727 A1 * | 4/2014 | Taimela | ............... | H02J 3/46 |
| | | | | 307/76 |
| 2014/0139198 A1 * | 5/2014 | Manlove | ............... | G05F 1/10 |
| | | | | 323/282 |
| 2014/0159365 A1 * | 6/2014 | Algrain | ............... | H02J 3/32 |
| | | | | 290/7 |
| 2015/0200615 A1 * | 7/2015 | Desabhatla | ............... | H02J 3/24 |
| | | | | 322/19 |
| 2015/0244296 A1 * | 8/2015 | Edwards | ............... | F01D 15/10 |
| | | | | 290/40 B |
| 2015/0303855 A1 * | 10/2015 | Verhulst | ............... | F25J 1/0022 |
| | | | | 62/611 |
| 2017/0214243 A1 * | 7/2017 | Rancuret | ............... | H02J 3/38 |
| 2017/0363013 A1 * | 12/2017 | Hino | ............... | F02C 3/10 |
| 2018/0198394 A1 * | 7/2018 | Desabhatla | ............... | H02P 9/102 |
| 2019/0031125 A1 * | 1/2019 | Rozman | ............... | H02J 7/00 |
| 2019/0360462 A1 * | 11/2019 | Epstein | ............... | F03D 7/0296 |
| 2020/0083823 A1 * | 3/2020 | Latulipe | ............... | H02K 47/04 |
| 2020/0162154 A1 * | 5/2020 | Duge | ............... | H04W 12/1204 |

OTHER PUBLICATIONS

Dhabu, S., et al., "Variable Cutoff Frequency FIR Filters: A Survey," dated Apr. 9, 2018, pp. 1-27, Electric Engineering and Systems Science > Signal Processing, arXiv:1804.02891 [eess.SP].

* cited by examiner

GAS TURBINE ENGINE GENERATOR POWER MANAGEMENT CONTROL SYSTEM

TECHNICAL FIELD

This disclosure relates to gas turbine engines and, in particular, to a gas turbine engine generator power management system.

BACKGROUND

Gas turbine engines provide torque on a rotating shaft by combustion of fuel to rotate a compressor and downstream turbine. An AC (alternating current) or DC (direct current) generator converts mechanical power into electric power. Generators may include a rotor and a stator where the rotor or the stator is coupled with a rotating prime mover, such as a gas turbine engine to generate electric power.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Figure 1:
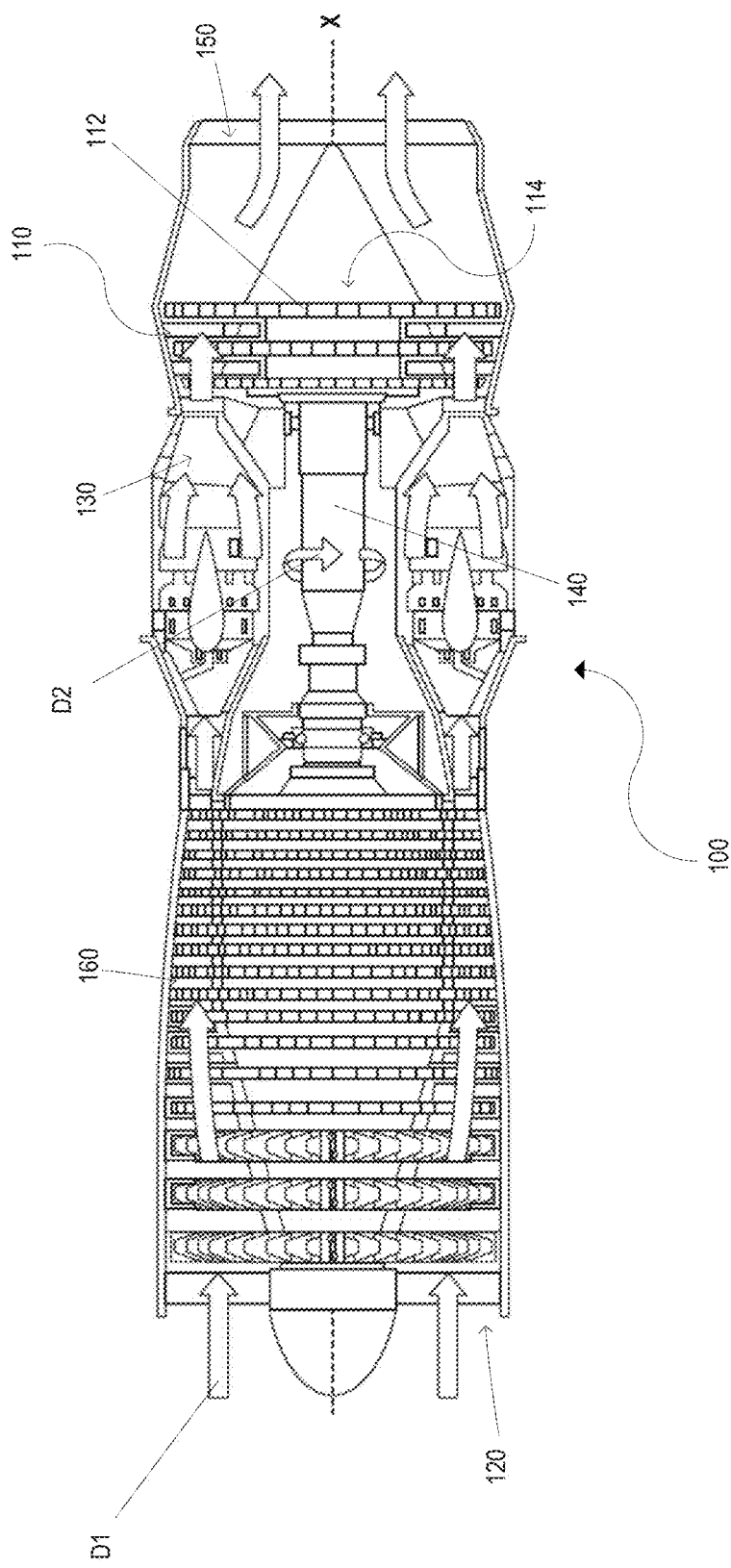
FIG. 1 illustrates a cross-sectional view of an example of a gas turbine engine.

A power management system as described herein may be used to power large dynamic loads with relatively short load switching frequencies. The power management system may use bi-directional converters, such as ac/dc or dc/dc converters, to deploy an energy storage system, such as lithium-ion batteries, together with a gas turbine engine and an ac or dc generator to provide relatively long duration power to the large dynamic electrical loads through multiple relatively short duration switching cycles. The system may include controller circuitry having an adaptive reference power tracking control algorithm, which executes load leveling to protect the gas turbine engine from large and dangerous thermal gradients. The controller circuitry may manage and prioritize smooth robust steady-state power command from the gas turbine engine with an adaptive high and low pass power filtering approach to selectively control loading of the generator and the energy storage system.

The power management system includes a generator rotatably driven by a gas turbine engine to output generator electric power to a common bus. The common bus is electrically coupled to a variable load comprising a pulse load. A source power converter is electrically coupled with the common bus. An energy source is electrically coupled with the source power converter. Controller circuitry included in the system includes adaptive filter circuitry 228 to receive and dynamically filter a power signal indicative of the variable load. The dynamically filtered power signal may be output as a demand setpoint for the gas turbine engine and generator to supply a part of the pulse load, and a difference between the filtered power signal and the power signal is output by the controller circuitry as a power output setpoint for the source power converter to supply a variable load remainder of the pulse load.

During operation, the system may be monitoring a power signal indicative of a load on a common bus. The load on the common bus may include an intermittent pulse load. The power signal may be filtered with an adaptive filter to generate a filtered power signal. The system may identify a relatively constant part of the power signal and dynamically adjust the adaptive filter in accordance with the identified relatively constant part of the power signal. A demand setpoint for a gas turbine engine rotatably driving a generator may be generated based on the filtered power signal provided by the dynamically adjusted adaptive filter. The gas turbine engine may rotatably drive the generator to produce generator output power for a portion of the pulse load in accordance with the demand setpoint. A power output setpoint for a source power converter may be generated in accordance with the filtered power signal provided by the dynamically adjusted adaptive filter. Source power may be supplied to the common bus from a power source via the source power converter. The source power supplied to a remaining portion of the pulse load according to the power output setpoint.

An interesting feature of the system relates to the controller circuitry being configured to dynamically adjust the adaptive filter based on the demand setpoint and measured actual power consumption of the variable load.

Another interesting feature of system relates to the controller circuitry being configured to dynamically adjust a gain and a time constant of the adaptive filter.

FIG. 1 is a cross-sectional view of a gas turbine engine 100. In some examples, the gas turbine engine 100 may supply power to and/or provide propulsion of a watercraft or aircraft. Examples of a watercraft include a ship, vessel or boat having a propeller, impeller or fan blades, which are provided electrical or mechanical power by the gas turbine engine, and examples of an aircraft may include a helicopter, an airplane, an unmanned space vehicle, a fixed wing vehicle, a variable wing vehicle, a rotary wing vehicle, an unmanned combat aerial vehicle, a tailless aircraft, a hover craft, and any other airborne and/or extraterrestrial (spacecraft) vehicle. Alternatively or in addition, the gas turbine engine 100 may be utilized in a configuration other supplying propulsion to an aircraft or watercraft such as, for example, an industrial application, an energy application, a power plant, a pumping set, a marine application, a weapon system, a security system, a perimeter defense and/or security system.

The gas turbine engine 100 may take a variety of forms in various embodiments. Though depicted as an axial flow engine, in some forms the gas turbine engine 100 may have multiple spools and/or may be a centrifugal or mixed centrifugal/axial flow engine. In some forms, the gas turbine engine 100 may be a turboprop, a turbofan, or a turboshaft engine. Furthermore, the gas turbine engine 100 may be an adaptive cycle and/or variable cycle engine. Other variations are also contemplated.

The gas turbine engine 100 may include an intake section 120, a compressor section 160, a combustion section 130, a turbine section 110, and an exhaust section 150. During operation of the gas turbine engine 100, fluid received from the intake section 120, such as air, travels along the direction D1 and may be compressed within the compressor section 160. The compressed fluid may then be mixed with fuel and the mixture may be burned in the combustion section 130. The combustion section 130 may include any suitable fuel injection and combustion mechanisms. The hot, high pressure fluid may then pass through the turbine section 110 to extract energy from the fluid and cause a turbine shaft of a turbine 114 in the turbine section 110 to rotate, which in turn drives the compressor section 160. Discharge fluid may exit the exhaust section 150.

As noted above, the hot, high pressure fluid passes through the turbine section 110 during operation of the gas turbine engine 100. As the fluid flows through the turbine section 110, the fluid passes between adjacent blades 112 of the turbine 114 causing the turbine 114 to rotate. The rotating turbine 114 may turn a shaft 140 in a rotational direction D2, for example. The blades 112 may rotate around an axis of rotation, which may correspond to a centerline X of the turbine 114 in some examples.

Figure 2:
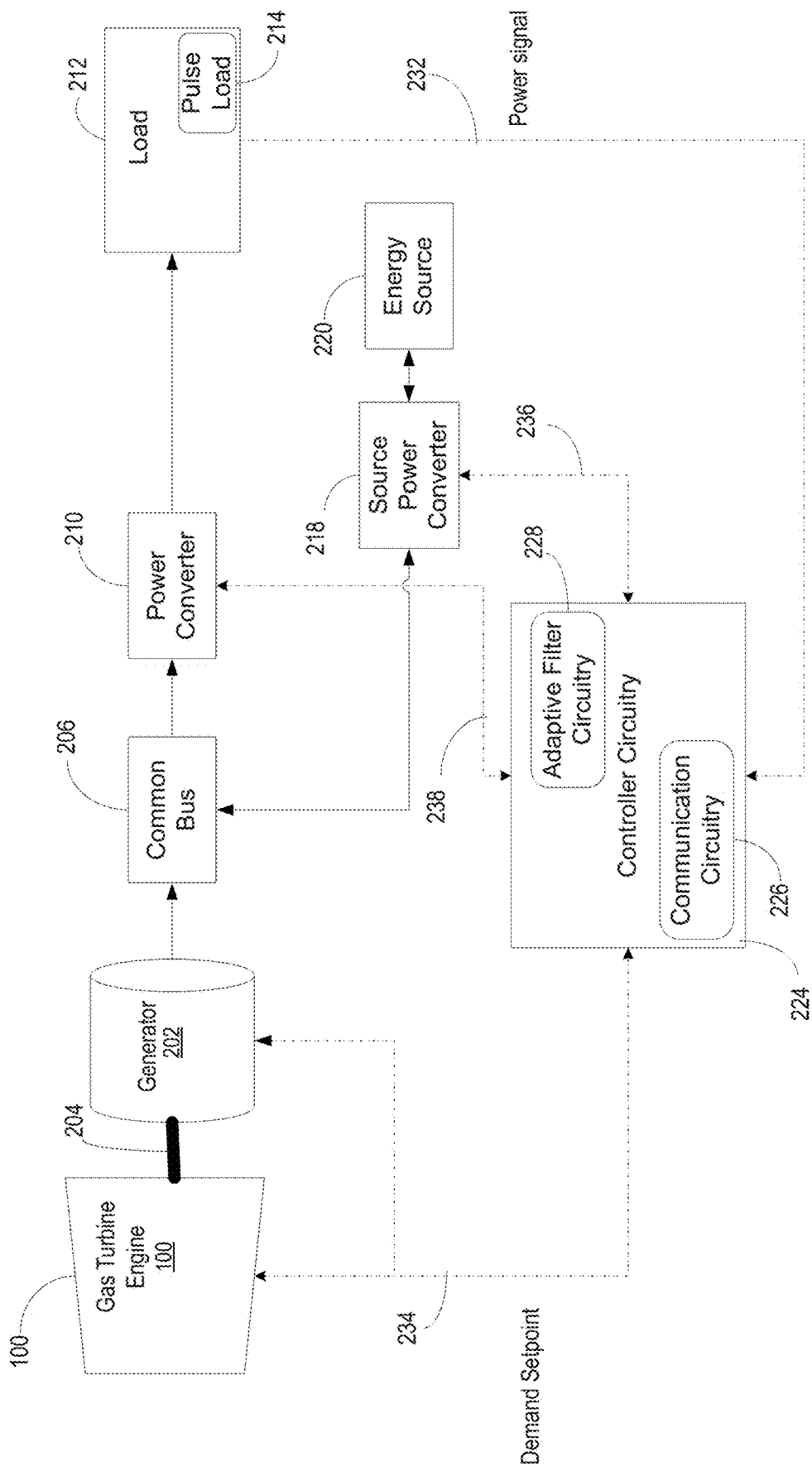
FIG. 2 is a block diagram illustrating an example gas turbine engine generator (GTEG) power management system.

FIG. 2 is a block diagram illustrating an example gas turbine engine generator (GTEG) power management system 200. The GTEG power management system 200 includes a generator 202 rotatably driven by a shaft 204 of a gas turbine engine 100 in order to output electric power to supply a common bus 206. The generator 202 may be an AC or DC machine, and may include rectifiers, and the like (not shown) to serve a load demand on the common bus 206. The generator 202 may include any type of electrical generator. Examples of the generator 202 include a synchronous generator, an induction generator, an asynchronous generator, a permanent magnet synchronous generator, an AC (Alternating Current) generator, a DC (Direct Current) generator, a synchronous generator with stator coils, or any other device that converts mechanical power to electric power.

The common bus 206 may supply power to a power converter 210, such as a buck and/or or boost converter. The common bus 206 may include any connector or connectors that conduct electricity. Examples of the common bus 206 may include a bus bar, a busway, a bus duct, a solid tube, a hollow tube, a wire, an electrical cable, or any other electrical conductor.

The power converter 210 may be a boost or a buck converter providing power at a predetermined voltage to a number of loads 212, including at least one intermittent pulse load(s) 214. In example systems, the power converter may be a static boost or static buck converter providing a rated voltage to the load 206. The power converter 210 may be a DC to DC converter, which receives power such as direct current (DC) voltage and current from the common bus 206. In examples where the common bus 206 provides alternating current (AC) power, the power converter 210 may be an AC to AC converter to adjust the voltage magnitude, or may include an inverter to convert the AC power to DC power supplied on a common bus 206. Where the common bus 206 supplies AC or DC power at a voltage desired by the load 212, the power converter 210 may be omitted.

The common bus 206 may also be in electrical communication with a source power converter 218 electrically coupled between the common bus 206 and an energy source 220. The source power converter 218 may be any type of electric or electromechanical device capable of converting an input voltage from one voltage level to another voltage level. Conversion between voltage levels may be buck or boost, and may be performed by, for example, high frequency switching using stored energy. In accordance with the application/system configuration, the source power converter 218 may be a unidirectional converter configured to charge and discharge at-will at various power rates (+/−W/s) with the same equipment. In an example, the source power converter 218 may be a bi-directional converter. Due to the anticipated variable voltage differences between the common bus 206 and the energy source 220, equipment such as the source power converter 218 and the energy source 220 may charge and discharge at variable rates up until hardware limitations are reached. The source power converter 218 may be, for example, a uni-directional DC to DC switched mode converter. In other examples, the source power converter 218 may be a uni-directional AC to AC or AC to DC converter.

The energy source 220 may be a battery, such as a Li-on battery, a capacitor, such as a super capacitor, a fuel cell, or some other source of power to supply the common bus 206 via the source power converter 218.

In an example, the pulse loads 214 may be a pulse load of greater than 50% of the rated output power of the generator 202. Power generated by the generator 202 is provided as a function of rotational torque supplied to the shaft 204 with the gas turbine engine 100. As the load on the common bus 206 varies, the voltage and current on the common bus 206 and therefore the load demand on the generator 202 and the source power converter 218/energy source 220 correspondingly varies. Short term relatively small variations in load demand may be transients that are handled, or absorbed, by the generator 202 by, for example, allowing variation in generator output voltage within an acceptable range. If, however, variations in load on the common bus 206, and corresponding changes in load demand, are too large and/or of too long duration, the generator 202 may demand greater or lesser rotational output torque from the gas turbine engine 100. Variations in rotational torque of the gas turbine engine 100 may undesirably vary the operating parameters, such as temperature of the gas turbine engine 100 resulting in thermal cycles, which may lead to higher maintenance frequency, accelerated material fatigue, and the like. For such longer duration variations in load, such as upon energization of a load pulse 214, a transient portion of the load on the common bus 206 may be supplied by a combination of the source power converter 218 and energy source 220 as described herein.

The GTEG power management system 200 also includes a controller circuitry 224. The circuitry of the controller 224 may include executable logic stored in memory to provide at least a portion of the functionality described herein. The controller 224 may include communication circuitry 226 to provide signal input/output capability for communication with the gas turbine engine 100, the generator 202, the load 212, the power converter 210, and the source power converter 218. The controller 224 may receive parameters, such as operational values via the communication circuitry 226. In addition, the controller may output parameters and control commands via the communication circuitry 226. Communication via the communication circuitry 226 may be wired or wireless, and may in the form of individual signals, groups of signals, network communication protocols, proprietary protocols and/or other forms of electronic based messaging or signal transmission.

The GTEG power management system 200 may be fully controlled by the controller 224. Alternatively, or in addition, the GTEG power management system 200 may include different controllers or control sub-systems performing portions of the functionality of the GTEG power management system 200. For example, the gas turbine engine 100 may be separately monitored and controlled with a control system such as a full authority digital electronics control (FADEC) that is in communication with the communications circuitry 226 of the controller 224. In that regard, the controller 224 may be fully compatible with existing control system(s) for the gas turbine engine 100 in order to communicate measured parameters, calculated parameters and control signals therebetween.

The controller 224 may be in communication with the gas turbine engine 100 and the generator 202 to receive operational parameters. For example, the generator 202 may provide a load demand signal, and the gas turbine engine 100 may provide a temperature signal indicative of an operational temperature of the gas turbine engine 100. In addition, the controller 224 may monitor and/or control the power converter 210 and the source power converter 218. Thus, in examples, the controller 224 may coordinate between and/or cooperatively operate the power converter 210 and the source power converter 218. During example operation as different loads are switched in and out from the common bus 206, the power converter 210 and the source power converter 218 may reactively adjust to account for changes in the baseline voltage at the common bus 206. In addition, the controller 224 may monitor the load 212, including the pulse load(s) 214, via the communication circuitry 226. The controller 224 may also be in communication and/or receive and monitor other operational parameters of the GTEG power management system 200, such as the voltage or current of the common bus 206, via the communication circuitry 226.

The controller circuitry 224 may also include adaptive filter circuitry 228. The adaptive filter circuitry 228 may include an adaptive low and/or high pass filter(s) to generate a load sharing plan between the generator 202 and the energy source 220 based on a magnitude and duration of the pulse load 214. Adaptive operation of the controller circuitry 224 may be realized through, for example, one or more of a field programmable gate array (FPGA) a digital signal processor (DSP), a microcontroller unit (MCU) and system on a chip (SoC). Compensation for transient behavior of the energy source 220 may be considered in, for example, a deployed power reference tracking algorithm to ensure robust energy source response to dynamic power demand changes due to the pulse load(s) 214.

The pulse load(s) 214 may be short duration high energy loads, such as, for example, 100-200 MW loads that are energized continuously for a predetermined relatively short period of time, such as less than 1 minute. When energized and then de-energized, each pulse load may represent a dynamic load demand creating a transient step change in load. In an example the step change in load demand may range from about zero to five percent to about (+/−five percent) fifty to ninety-five percent, or from about (+/−five percent) zero to five percent to eighty to ninety-five percent of the total load on the common bus 206 with step changes in bus loading occurring over a time period of about 100 milliseconds or less (where about is +/−10 milliseconds). Examples of the pulse load include vehicle electronics, a vehicle, an aircraft, a directed-energy weapon, a laser, a plasma weapon, a railgun, a microwave generator, a pulse-powered device or other relatively short duration power consuming system controlled by the controller 224.

During operation, the load 212 may be a dynamic load having sharp ramp rates such that the load 212 pulsates with variable magnitude, frequency and duty cycle due to the intermittent and relatively short duration energization of the pulse load(s) 214. In an example, a frequency of the pulse load 214 may be between $1\times10^{-2}$ seconds and 5 seconds resulting in short timescale ramp rates of the load 212. Such short timescale ramp rates are in sharp contrast to load peak shaving or other such load characteristics which are managed over significantly longer time periods, such as hourly peak demand.

The generator 202 may be rotatably driven by the gas turbine engine 100 to output generator electric power to the common bus 206 to supply a portion of the variable load 212, which includes pulse load(s) 214 via the power converter 210. The portion of variable load 212 supplied by the generator electric power may be that portion of the dynamic load identified, using the adaptive filter circuitry 228, as a relatively constant or a substantially constant load. The remainder of the dynamic load 206 may be supplied/absorbed by the energy source 220 by controlling the source power converter 218.

The source power converter 218 is also electrically coupled with the common bus 206 and may be controlled to provide current flow in both directions between the energy source 220 and the common bus 206 in accordance with the high frequency portion of the variable load demand of the dynamic load 212 and the relatively constant power supplied by the generator 202.

In an example of the GTEG power management system 200, the controller 224 may determine and dynamically adjust the portion of the load 212 identified as a relatively constant load to directly or indirectly manage the output torque of the gas turbine engine 100. Dynamic adjustment of the identified portion of the load 212 may be performed by the controller 224 by controlling the demand signal 234 and the source power converter 218 to maintain transient operational parameters, such as the operating temperature, of the gas turbine engine 100 within a predetermined range or below a predetermined threshold.

Control of the gas turbine engine 100 may be separate and independent from controlling the demand signal 234 and the source power converter 218. For example, during operation the gas turbine engine 100 may be separately and independently speed controlled to maintain a speed setpoint. As the load on the common bus 206 changes, the level of output torque from the gas turbine engine 100 to maintain rotational speed of the gas turbine engine 100 and the generator 202 at the speed setpoint may vary. The controller 224 may manage the loading of the common bus 206 independent of the control of the gas turbine engine 100.

Controlling the demand signal 234 and the source power converter 218 may include the controller 224 monitoring one or more transient operational parameters of the gas turbine engine 100, such as an operational temperature. The demand signal 234 and the source power converter 218 may be managed by the controller 224 to avoid transient variations in the output torque of the gas turbine engine 100 resulting in the presence of undesirable cyclical changes in transient parameters of the gas turbine engine 100. An example of a desirable predetermined range or predetermined cycling threshold of a transient operational parameters of the gas turbine engine 100 is maintaining an operational temperature of the gas turbine engine in a range of +\-25% of rated temperature.

Thus, the GTEG power management system 200 may establish and control the amount of the relatively constant load with the goal of protecting the gas turbine engine 100 from experiencing undesirable repeated cycles, such as thermal cycles. Undesirable cycling of the gas turbine engine 100, such as thermal cycling, may result in accelerated component fatigue and a correspond decline in engine lifespan. To avoid such undesirable cycling, the relatively constant load is identified and a corresponding demand setpoint 234 is generated to allow for corresponding substantially continuous torque demand at the gas turbine engine 100.

In an example, some amount of load variations (or transients) on the common bus 206, such as less than 25% for under 0.5 seconds, may be absorbed by the generator 202. The generator 202 absorbing such "instantaneous" load demand may, for example, result in changes in voltage and/or current flow on the common bus 206 without creating a significant change in demand for rotational torque output by the gas turbine engine 100.

In addition, or alternatively, load variations that may cause changes in output torque demand of the gas turbine engine 100 of a relatively short duration may be absorbed by the gas turbine engine, resulting in acceptable variations in transient operational parameters. For example, relatively small thermal constants in the gas turbine engine 100 may resulting in little or no variation in the temperature of the gas turbine engine. An example factor affecting changes in a transient operational parameter is a time constant for gas temperature changes at the turbine section outlet, which may be referred to as turbine outlet temperature (TOT). The TOT may respond relatively quickly, such as within 0.5 seconds, with undesirable temperature variations to relatively large load variations (such as a 50% or greater step change in load), whereas with lesser step changes in load, the temperature variations due to variations in load may be lower and/or within an acceptable range for a long enough period of time, thereby avoiding undesirable cycling.

In this regard, the actual amount of load variations (or transients) that are undesirable will be a function of characteristics of the generator 202 and the gas turbine engine 100, along with other parameters such as the aggressiveness of the torque demand for output torque from the gas turbine engine 202. Accordingly, the portion of the load 212 identified by the controller circuitry 224 as the relatively constant load may be that portion of the load creating a load demand such that the generator 202 remains substantially unchanged, and the output torque of the gas turbine engine 100 may also be substantially unchanged. As used herein, the output torque of the gas turbine engine being "substantially unchanged" or "substantially maintained" or "substantially constant" refers to changes in the operation of the gas turbine engine that do not result in undesirable cycling of the gas turbine 100, such as thermal cycling. The portion of the load 212 on the common bus 206 that is a "substantially constant load" or "substantially constant" or "relatively constant" as used herein refers to an absence of corresponding changes in output power of the generator 202 that result in undesirable cycling of the gas turbine 100, such as thermal cycling.

Figure 3:
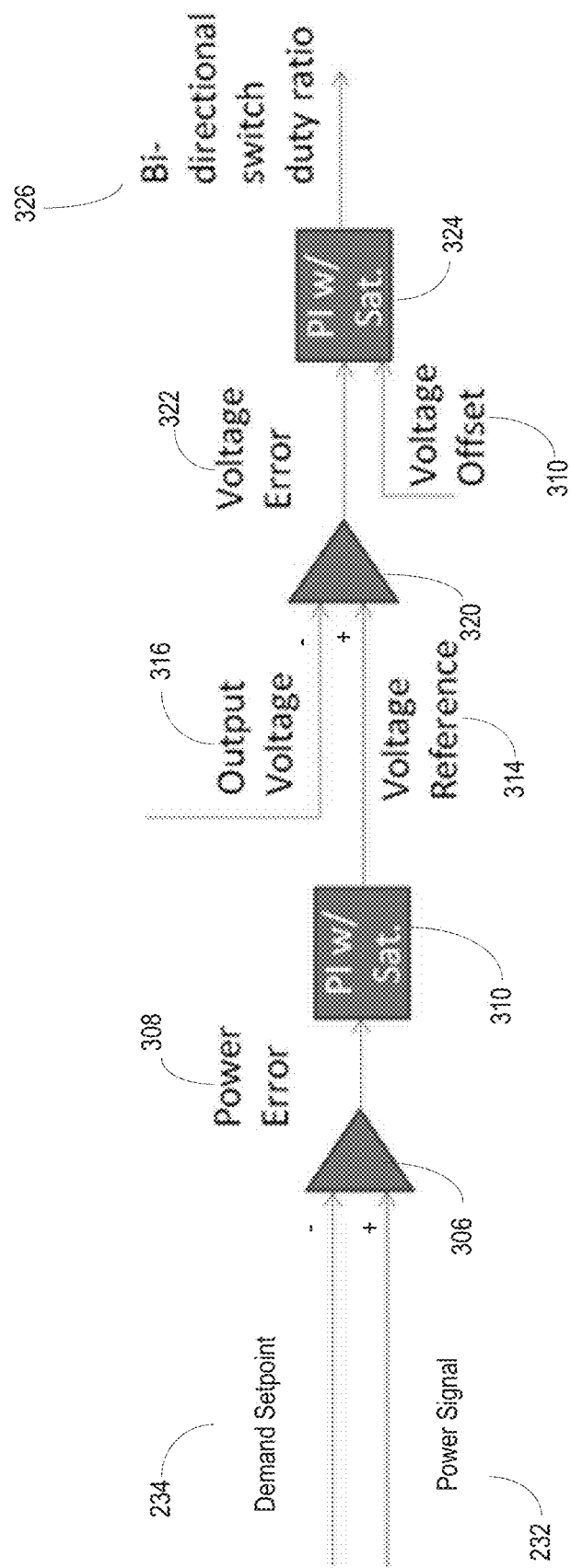
FIG. 3 is a logic diagram illustrating an example of control of switching of source power converter.

FIG. 3 is a logic diagram illustrating an example of control of switching of source power converter 218 by the controller circuitry 224. In this example, the power converter 218 is a variable frequency switching converter. During operation, the controller circuitry 224 may monitor an output power measurement which is the dynamically filtered power signal provided as the demand setpoint 234 being supplied to the gas turbine engine 100 and/or the generator 202. In addition, the controller circuitry 224 may receive a reference power signal, which is the power signal 232 representative of the variable load 212. A summation circuit 306 may determine a difference between the power signal 232 and the filtered power signal 234 and output a power error 308. A control block 310, such as the illustrated first proportional/integral control block with saturation, may output a voltage reference signal 314 based on the power error 308 received. The saturation may provide an anti-windup feature that checks the output of the control block 310 for saturation and if the P and I terms exceed a predetermined control range a new integrator value is not retained to avoid deepening the saturation.

A voltage reference signal 314 may be summed with an output voltage 316 of the source power converter 218 by a summation circuitry 220 to provide a voltage error signal 322. A control block 324, such as the illustrated second proportional/integral control block with saturation, may output a bi-directional switch duty ratio signal 326, which may control the variable frequency switching converter. In other examples, other forms of power converters, such as a rectifier, inverter, DC-DC converter or other converter of electrical energy may be used in conjunction with corresponding control logic to control the output power or voltage of the source power converter 218.

Referring again to FIG. 2, load sharing between the generator 202 and the energy source 220 to support the dynamic load 206 may be controlled by the controller circuitry 224 to minimize thermal cycling of the gas turbine engine 100. Thus, a relatively steady state portion of the variable load 212 may be established and dynamically adjusted by the controller circuitry 224 using the adaptive filter 228 within the parameters of minimizing thermal cycling of the gas turbine engine 100. For example, the adaptive filter circuitry 228 included as part of the controller 224 may be a low pass filter that operates to receive and dynamically filter a power signal 232 indicative of the variable load 212, including the pulse load(s) 214. In an example, the power signal 232, which may also be referred to as a reference or power control signal, may be a voltage magnitude. In another example, the power signal 232 may be a power signal such as watts or megawatts. The dynamically filtered power signal may be output as a demand setpoint 234 for at least one of the gas turbine engine 100 and generator 202. The demand setpoint 234 may result in the generator 202 supplying power to only that portion of the pulse load 214 that will not result in undesirable cycling of the gas turbine engine 100. The difference between the filtered power signal, or demand setpoint 234, and the power signal 232 may be output by the controller circuitry 224 as a power output setpoint 236 for the source power converter 218. The power output setpoint 236 may be representative of a relatively variable portion of the variable load 212. The source power converter 218 may dynamically manage the energy source 220 to supply or absorb a remainder of the pulse load 214 represented by the power output setpoint 236.

In an example, the relatively constant load portion of the variable load 212 may be identified with a low pass filtered signal, and the remainder of the variable load 212 may be identified using a high pass filtered signal. The adaptive filter circuitry 228 may provide a high-pass filtered signal by, for example, low-pass filter subtraction. The low pass filtered signal may also be used to directly drive a demand signal, such as the demand setpoint 234, for an internal combustion engine, such as the gas turbine engine 100, and/or the generator 200. In other examples, a diesel engine and corresponding generator may be similarly deployed. In the case of internal combustion engine load leveling, a priority of the GTEG power management system may be maintaining maximally level load at the engine.

A dynamically adaptive filtering approach may be implemented with the adaptive filter circuitry 228. An output of the adaptive filter circuitry 228 may identify the low-frequency portion of the variable load 212, whereas high pass filtering by the adaptive filter circuitry 228 may identify a faster transient portion of the dynamic load 206. Thus, desirable operation of the gas turbine engine and generator, or diesel generator, may be achieved with the GTEG power management system 200 since the demand signal has had a sufficient amount of high frequency content removed to provide a relatively constant load demand signal.

Voltages may be controlled at the common bus 206 by the controller 224 so that current flows both directions between the common bus 206 and the energy source 220 in order to maintain a substantially level power loading of the generator 202 and corresponding power output at the gas turbine engine 100. The voltages at the common bus 206 may be controlled via the source power converter 218 by modulating bi-directional current and power flow between the common bus 206 and the energy source 220. In this regard, the controller circuitry 224 may estimate duty cycles and thus voltages at the source power converter 218 using the adaptive filter 228 to generate a desired power flow profile. An alternative method to drive the desired output power is to directly control power demand to the gas turbine engine 100, such as by controlling the FADEC of the gas turbine engine 100 or the power output of the generator 202. In either case, due to the relatively low frequency power demand variations associated with the relatively constant load, in examples the demand setpoint 234 may be integrated into existing power demand FADEC designs without the need for additional signal conditioning or signal management, such as ad-hoc rate limiters and magnitude limiter controls.

In addition, voltage control at the common bus, along with power management of the generator 202 and the energy source 220, may be performed by the controller circuitry 224 using the power converter 210. The power converter 210 is electrically coupled between the common bus 205 and the variable load 212, and is configured to convert a voltage of the common bus 205 to a supply voltage of the variable load 212. The controller circuitry 224 may use a voltage demand signal 238 to control the power converter 210 in connection with using the adaptive filter circuitry 228 to establish and/or maintain the relatively constant portion of the dynamic load being supplied by the generator 202, and the high frequency variable load 212 being supplied or absorbed by the source power converter 218 and the energy source 220.

The power signal 232 providing a voltage and/or power measurement indicative of the total dynamic load 212 may be provided as a feedback to the controller circuitry 224. In an example, voltage and current meters may sense voltages and currents of the variable load 212, the common bus 206, the output of the generator 202 or any other advantageous location in the system to provide the voltage and/or power measurement to the controller circuitry 224. Based on the power signal 232, the controller circuitry 224 may drive dynamic filtering behavior of the adaptive filter 228. The controller circuitry 224 may also perform a supervisory function by receipt of additional information used to anticipate the energization or de-energization of the pulse load 214. Such pulse load anticipation may be provided to other systems and controls as a priori information, such as for load anticipation. In addition, the controller circuitry 224 may also modulate a range of power output by the source power converter 218 to satisfy high frequency changes in load demand due to, for example energization and de-energization of the pulse load 214. Such modulation of the range of power output from the energy source 202 may be a result of target voltage changes, such as at the power converter 210, and/or if the target output voltage changes at the generator 202.

The GTEG power management system 200 may advantageously use the power signal 232 as feedback to control leveling load changes made by dynamically adjusting the adaptive filter 228 in accordance with the power signal 232. Dynamic adjustment of the adaptive filter 228 may be performed by the controller circuitry 224 based on logic, such as adaptive filter fuzzy logic and surrounding support logic to automatically determine an optimal quasi-steady-state power level for the generator 202, and corresponding high frequency oscillating load demand of the remainder of the pulse load 214 for the source power converter 218 and energy source 220. It is to be noted that the adaptive filter 228 is not dynamically adjusted for power quality concerns and therefore the filter structure of the adaptive filter 228 is different from filters designed to clear high or low frequency portions of a signal, such as a low pass filter designed to clear ultra-high frequency noise (in the order of kHz and/or mHz). The adaptive filter 228 may have improved response over other active filters since the adaptive filter 228 provides dynamic response to changes in the power signal 232 without unwanted broadband signal magnitude reduction or magnification. Accordingly, the active filter gain may be adaptively adjusted to address steady-state errors based on a desired trajectory or profile of the variable load 212 that avoids cycling of operational parameters of the gas turbine engine 100, such as thermal cycling. The time constant of the adaptive filter 228 may also be adjusted to minimize undesirable frequency domain changes (shape changes of a load profile of the variable load 212) due to transients in the power signal that create undesirable cycling of the gas turbine engine operational parameters.

Figure 4:
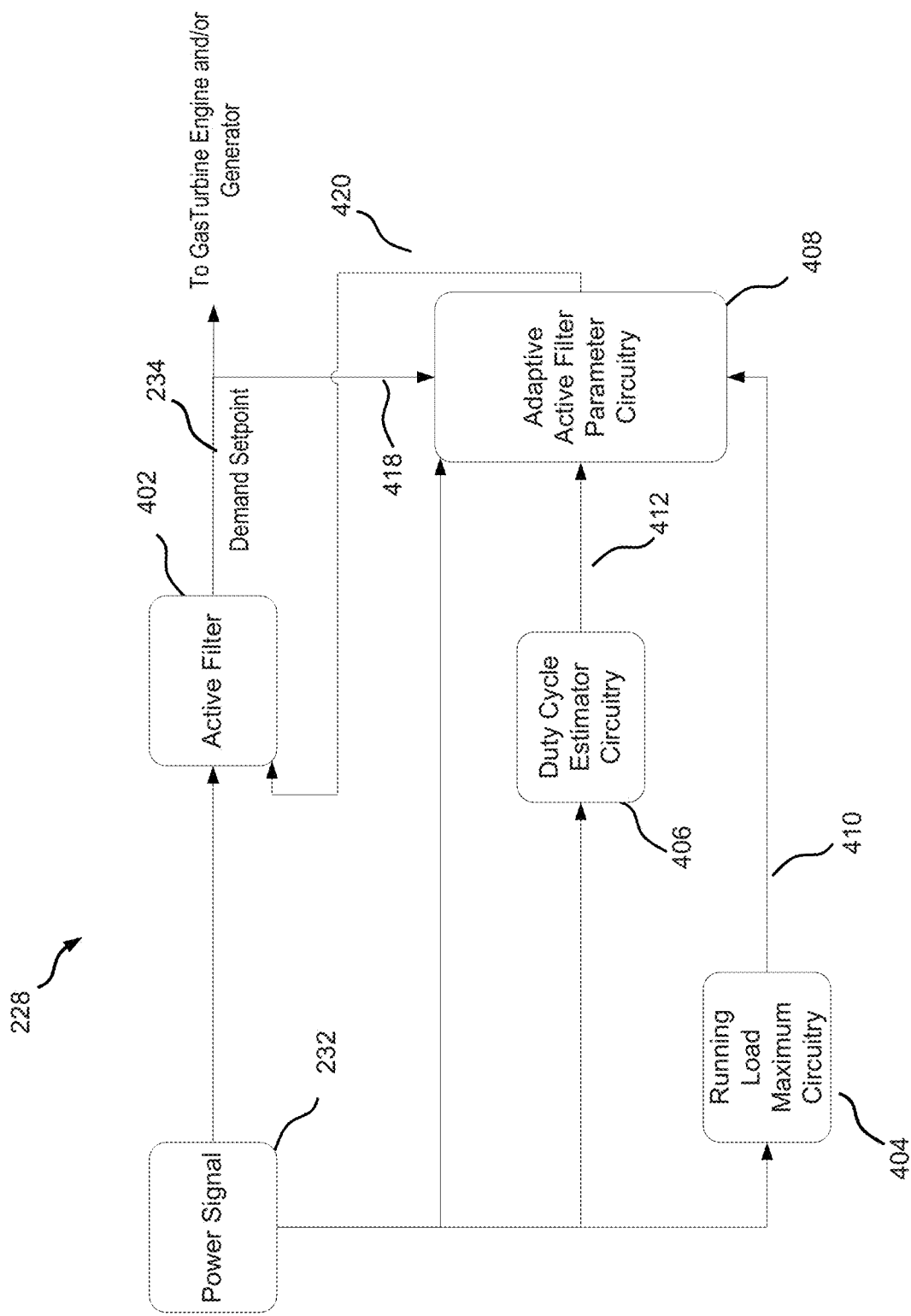
FIG. 4 is a block diagram of an example of adaptive filter circuitry.

FIG. 4 is a block diagram of an example of the adaptive filter circuitry 228. The adaptive filter circuitry 228 may receive the power signal 232 as an input signal to an active filter 402, a running load maximum circuitry 404 and a duty cycle estimator circuitry 406. The active filter 402 may be, for example, a time varying active low pass filter. In other examples, the active filter 402 may be a time varying high pass filter. Example filters include lead-lag filters, Sallen-Key, Butterworth filter, Chebyshev type 1, Chebyshev type 2, elliptic, and other types of filters where an adaptive time constant and gain can be applied. In the examples of a Butterworth, and adaptive Butterworth, or Chebyshev type 2 filter, a flat response at cutoff may be achieved, but may be dependent on cutoff frequency. The active filter 402 described herein provides advantage over a common low-pass filter with very large or static time constant, since the active filter 402 may have a sufficiently fast approach to steady state as opposed to waiting 10 s or seconds to minutes with a static time constant filter design. With the active filter 402 configured as a low pass filter, a smooth response above the cutoff frequency may be maintained. The dynamically filtered power signal output by the active filter 402, which is the demand setpoint 234, may be adjusted on the fly as the power signal 232 changes by automatically adjusting filter parameters, such as a time constant and gain of the active filter 402.

Automatic adjustment of the filter parameters may be performed by an adaptive active filter parameter circuitry 408. A running load current max signal 410 output by the running load maximum circuitry 404 and an estimated duty cycle signal 412 output by the duty cycle estimator circuitry 406 may be provided as inputs to the adaptive active filter parameter circuitry 408. In addition, the dynamically filtered power signal 234 output by the active filter 402 may be provided as a feedback input 418 to the adaptive active filter parameter circuitry 408. The output of the adaptive active filter parameter circuitry 408 may be a parameters signal 420, which may include one or more filter parameters to dynamically adjust the active filter 402. Parameters dynamically output by the adaptive active filter parameter circuitry 408 may include a time constant (a0) and a filter gain (b0). Thus, the controller circuitry 224 may dynamically adjust the time constant and/or the gain of the adaptive filter circuitry 228.

Referring again to FIGS. 2 and 4, the adaptive filter circuitry 228 may also adjust the filter parameters such as a filter time constant and gain based on changes in pulse magnitude, frequency, waveform and duty cycle of the power signal 232 due to, for example, changes in the pulse load 214. Also due to the adjustable parameters such as the filter time constant, the adaptive filter circuitry 228 may include built-in ramp rates (ramp up and ramp down rates) that may account for limits in an initial transient response of the gas turbine engine 100. The configuration of the adaptive filter circuitry 228 is therefore well suited for repetitive pulse loads 214 used in connection with receiving power from and supplying power to the energy source 220. For example, power consumption by the pulse load 214 and charge and discharge components such as batteries and capacitors in the load source 220 may be serviced as the high frequency variable load portion of the dynamic load 212.

By dynamic adjustment of the adaptive filter circuitry 228, such intermittent and highly variable loads are maintained with as balanced a charging and discharging cycle as possible so that the net charge rate over extended periods of time remains as close to 0 as possible. Thus, with pulse loads such as, for example, a directed energy weapon, an endless magazine may result. This approach also minimizes oversizing of the generator for relatively small pulse loads, where oversizing is for the purpose of staying away from undesirable cycling, such as thermal swings of the gas turbine generator 100. The GTEG power management system 200 may therefore shield the gas turbine engine 100 from undesirable operational conditions such as thermal transients, low cycle fatigue (LCF), and high cycle fatigue (HCF), which may all impact component lifing of the gas turbine engine 100.

Figure 5:
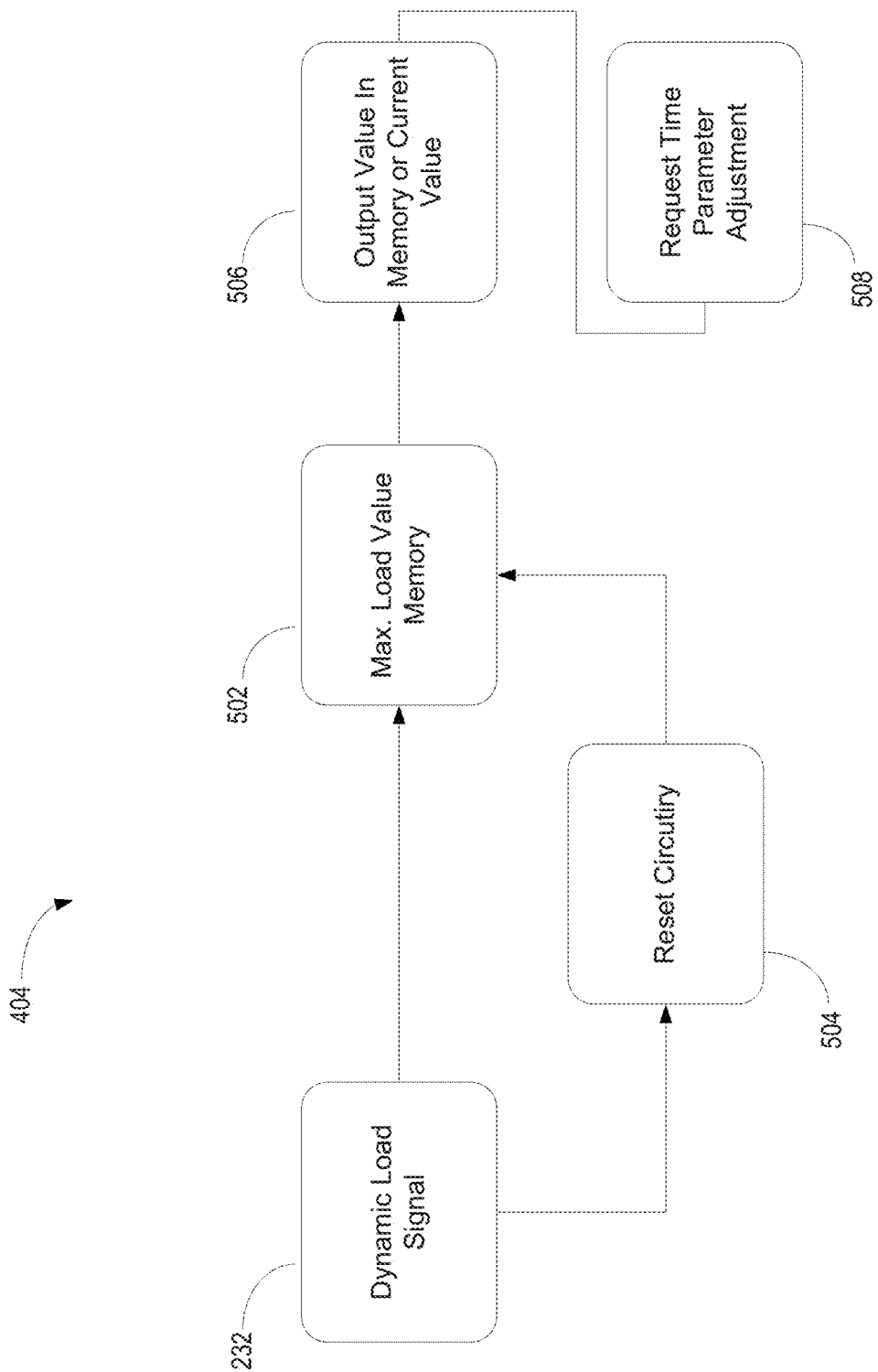
FIG. 5 is a block diagram of an example of running load maximum circuitry.

FIG. 5 is a block diagram of an example of running load maximum circuitry 404. The running load maximum circuitry 404 may monitor and store a magnitude of the power signal 232 in a maximum load value memory 502 to capture peaks of the dynamic load during operation. The value stored in the maximum load value memory 502 may be dynamically reset by reset circuitry 504. The stored maximum load value may be reset to a higher value, for example, when increases in the peak value of the power signal 232 are sensed. The store maximum load value may also be reset to a lower value, such as when the actual value of dynamic load remains below the value stored by a predetermined amount for a predetermined time. Accordingly, when the pulse load is reduced due to, for example, degradation, outage or other reduction in the load pulse the dynamic load value may be correspondingly reset to a new lower peak value.

Output circuitry 506 may output the currently stored value of the maximum dynamic load, or a current value of the dynamic load, whichever is greater to requestor circuitry 508. Requestor circuitry 508 may output a request to the adaptive active filter parameter circuitry 408 to adjust a filter time parameter in accordance with updated maximum value of the dynamic load. If, for example, the value stored in the maximum load value memory is increased, the filter time parameter may be correspondingly decreased. If for example, the value stored in the maximum load value memory is decreased, the filter time parameter may be correspondingly increased.

Figure 6:
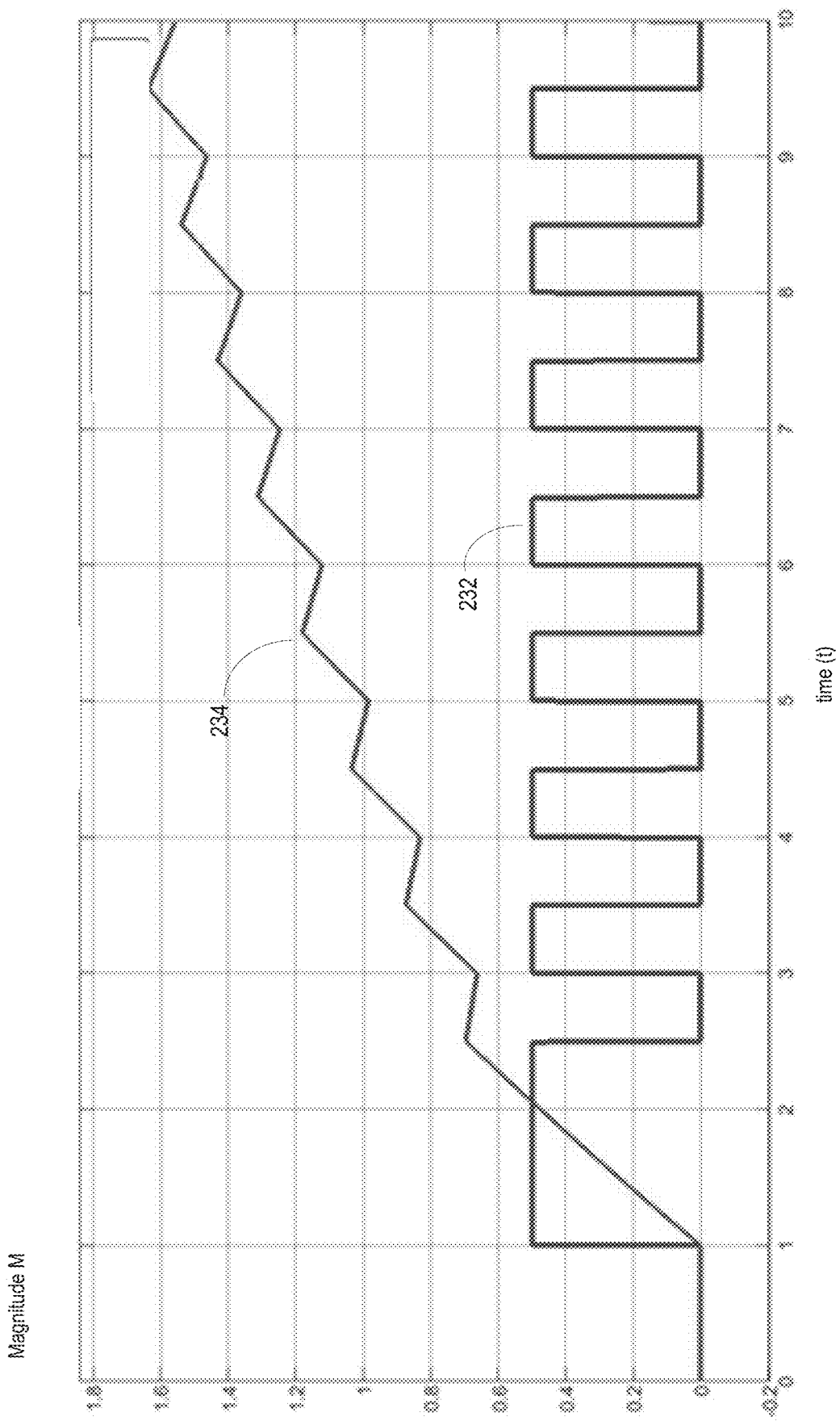
FIG. 6 is an example of a dynamic load profile.

In that regard, FIG. 6 is an example of a dynamic load profile. Referring to FIGS. 2, 4 and 6, the power signal 232 is illustrated over time (t) as a pulse load is energized and de-energized to a peak magnitude (M). Also illustrated in in FIG. 6 is an example of the output of the adaptive filter 228 as the demand setpoint 234. In this example, the adaptive filter 228 includes low pass filter 402 and the response of the adaptive filter 228 has too small of a time constant parameter from the adaptive active filter parameter circuitry 408 such that the demand setpoint 234 sequentially increases beyond what is a relatively constant portion of the dynamic load. Accordingly, the load on the generator 202 may correspondingly vary resulting in undesirable cycling, such as thermal cycling of the gas turbine engine 100.

Figure 7:
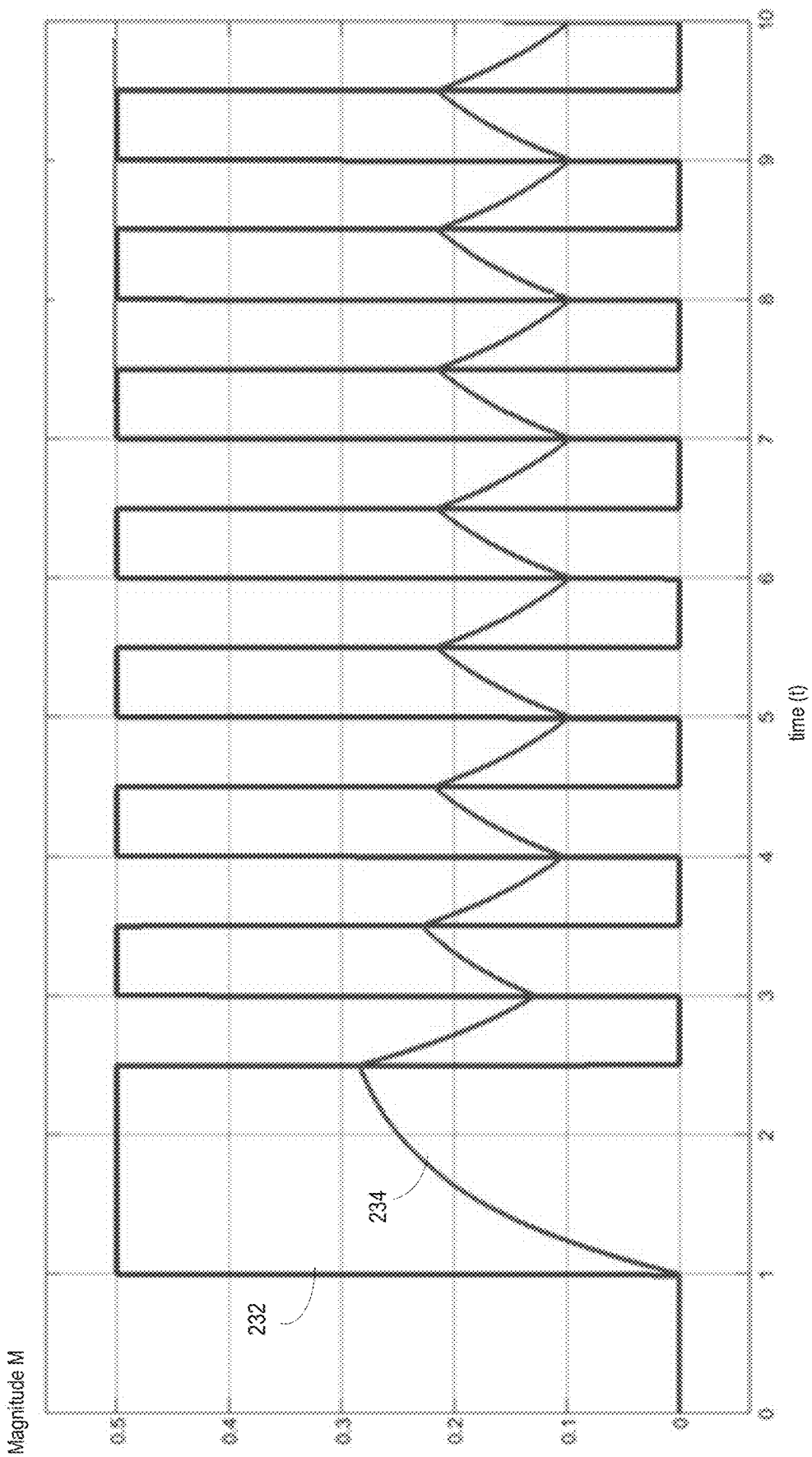
FIG. 7 is another example of a dynamic load profile.

FIG. 7 is another example of a dynamic load profile. In FIG. 7, the power signal 232 is illustrated over time (t) as a pulse load is energized and de-energized. Also illustrated in in FIG. 7 is an example of the output of the adaptive filter 228 as the demand setpoint 234. In this example, the adaptive filter 228 includes the low pass filter 402 and the response of the adaptive filter 228 has too large of a time constant such that the demand setpoint 234 sequentially decreases below what is the relatively constant portion of the dynamic load. The load on the generator 202 may correspondingly vary resulting in undesirable cycling, such as thermal cycling of the gas turbine engine 100.

Figure 8:
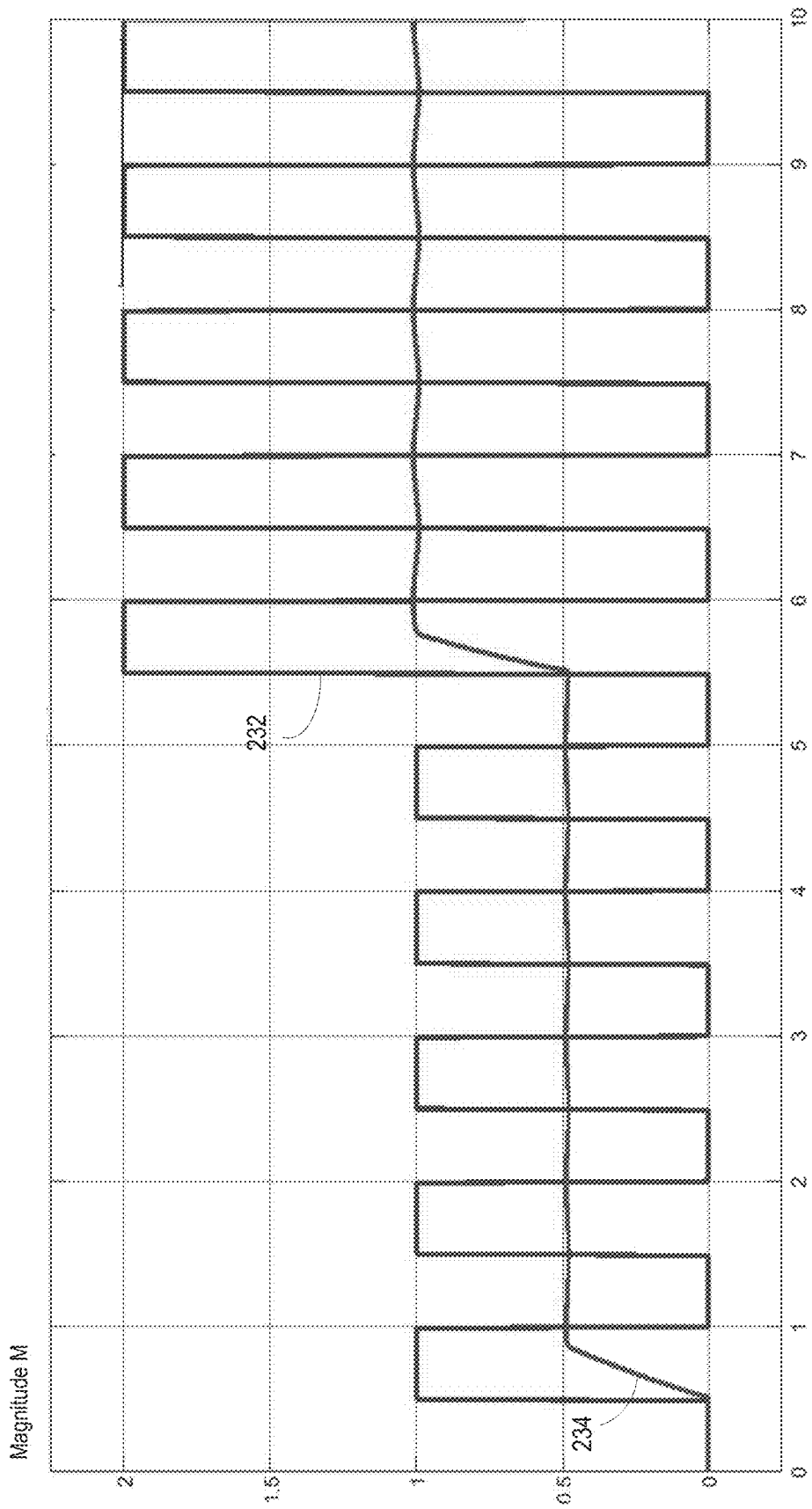
FIG. 8 is another example of a dynamic load profile.

FIG. 8 is another example of a dynamic load profile. In FIG. 8, the power signal 232 is illustrated over time (t) as a pulse load is energized and de-energized, and the magnitude of the dynamic load value increases during time (t)=5 to a higher magnitude M. Accordingly, the maximum load value stored in the maximum load value memory may be increased from "1" to "2". Note that the y-axis values for Magnitude M in FIGS. 6-8 are unit less values provided for illustrative purposes. Also illustrated in in FIG. 8 is an example of the output of the adaptive filter 228 as the demand setpoint 234. In this example, the adaptive filter 228 is a low pass filter and the response of the adaptive filter 228 has a time constant that provides a demand setpoint 234 indicative of a portion of the dynamic load that is relatively constant as the pulse load energizes and de-energizes at a substantially constant magnitude. Between time (t) of 5 and 6, the demand setpoint 234 correspondingly increases as the maximum load value stored in the maximum load value is increased, such that the demand setpoint 234 is again representative of a relatively constant portion of the dynamic load at the increased magnitude (M) of the pulse load peak. In this example, the time constant parameter is adjusted by the adaptive active filter parameter circuitry 408 to provide a timely response to changes in the magnitude (M) of the intermittent pulse load at a ramp rate that does not create undesirable thermal cycling of the gas turbine engine 100.

Figure 9:
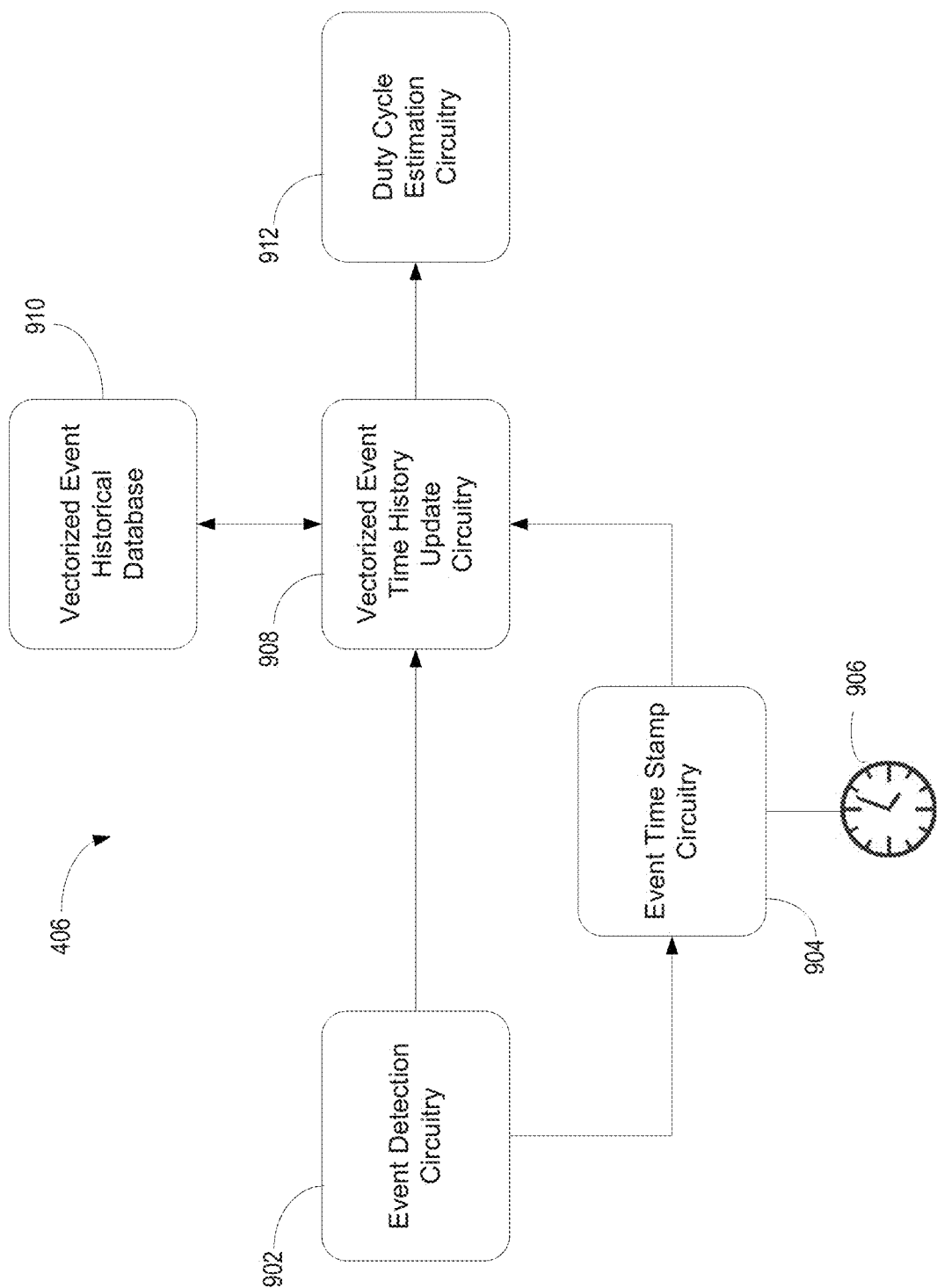
FIG. 9 is a block diagram of an example of duty cycle estimator circuitry.

FIG. 9 is a block diagram of an example of the duty cycle estimator circuitry 406. The duty cycle estimator circuitry 406 may include event detection circuitry 902, which may detect energization or de-energization of a pulse load in the power signal 232 as an event. Detection of such events may be provided to event timestamp circuitry 904, which may assign a time stamp to each detected event based on an input time from a clock timer 906. The output of the event timestamp circuitry 904 may be a timestamp associated with the corresponding event, which is provided to a vectorized event time history update circuitry 908. The vectorized event time history update circuitry 908 may also receive the event from the event detection circuitry 902. From the received event and corresponding timestamp, the vectorized event time history update circuitry 908 may vectorize the event and store the event in a historical vectorized event database 910 stored in memory.

The time stamped vectorized event may also initiate an estimation of a duty cycle of the next pulse load by a duty cycle estimation circuitry 910. Prediction of the next duty cycle created by a pulse load in the power signal 232 may be performed by the duty cycle estimation circuitry 910 using the most recently time-stamped vectorized event input and the vectorized event historical database 910.

Figure 10:
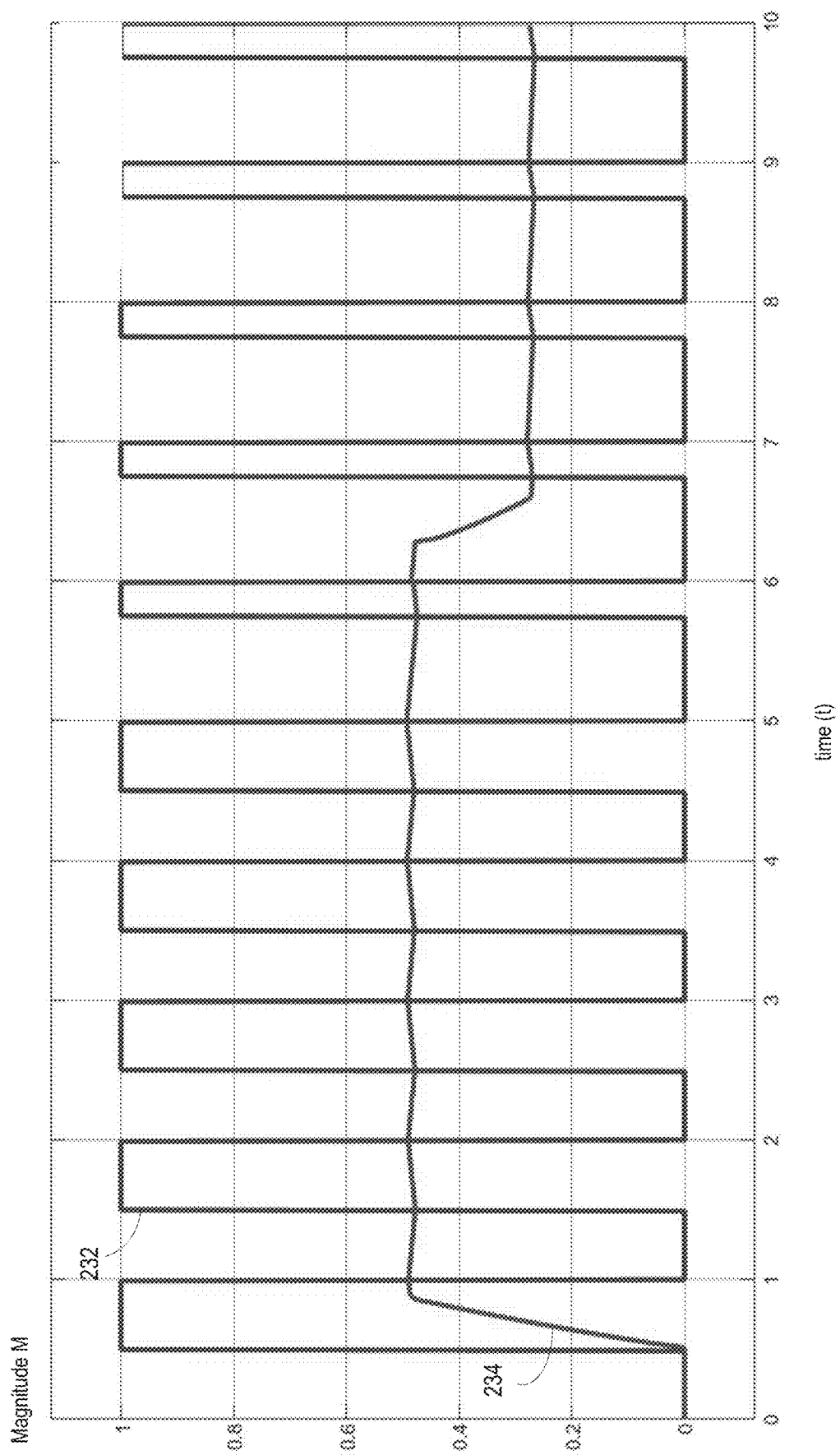
FIG. 10 is another example of a dynamic load profile.

FIG. 10 is another example of a dynamic load profile. Referring to FIGS. 2 and 10, the power signal 232 is illustrated over time (t) as a pulse load is energized and de-energized. At time (t)=5, the duty cycle of the dynamic load value (power signal 232) changes. In the illustrated example, target steady-state power indicated by the demand set point 234 is a function of the inverse of the duty ratio. For example, 75% duty results in 75% torque load from the gas turbine engine 100 to supply the relatively constant, or substantially constant, load. In this example, the energy source 220, such as a battery or capacitor, may be recharged or replenished at a 75% power rate for 25% of the time to maintain a continuous supply of power, such as to satisfy an "endless magazine" objective. In this same example of FIG. 10, after time (t)-5, a 25% duty is present, which controls the gas turbine engine 100 to supply 25% of the variable load 206 so that the battery is charged at a 25% power rate for 75% of the time to maintain a relatively constant, or substantially constant, load. Using these techniques, the system may develop a continuous supply of power for the "endless magazine" objective.

Referring again to FIGS. 2 and 4, the adaptive filter circuitry 228 may adaptively control the demand setpoint 234 to represent the relatively constant portion of the dynamic load 212 as the pulse load 214 varies in not only magnitude and/or duty cycle, but also in frequency and/or waveform. Compensation for one or more of these variables being present in the pulse load 214 may result in automatic changes in the active filter 402 and corresponding adjustments in the portion of the dynamic load indicated as the relatively constant load.

For example, in example implementations where the pulse load has a constant duty cycle, the adaptive filter circuitry 228 may use the running load maximum circuitry 404 to adjust filter parameters such as the time constant of the active filter 402. The time constant of the active filter 402 may be adaptive to compensate for a variable magnitude of the load pulse. In addition, the adaptive active filter parameters controller circuitry 408 may be used to adjust the filter parameters such as the gain to compensate for a variable waveform and/or a variable frequency of the pulse loads 214.

In another example, where the pulse load has a constant peak load magnitude, the adaptive filter circuitry 228 may use the duty cycle estimator circuitry 406 to adjust filter parameters such as the gain of the active filter 402. The gain of the active filter 402 may be adaptive to compensate for variability in the duty cycle. In addition, the adaptive active filter parameters controller circuitry 408 may be used to adjust the filter parameters such as the gain to compensate for a variable waveform and/or a variable frequency of the pulse loads 214.

In still another example, where the pulse load has a constant frequency, the adaptive filter circuitry 228 may use the running load maximum circuitry 404 to adjust filter parameters such as the time constant of the active filter 402, and use the duty cycle estimator circuitry 406 to adjust filter parameters such as the gain of the active filter 402. In addition, the adaptive active filter parameters controller circuitry 408 may be used to adjust the filter parameters such as the gain to compensate for a variable waveform of the pulse loads 214.

Figure 11:
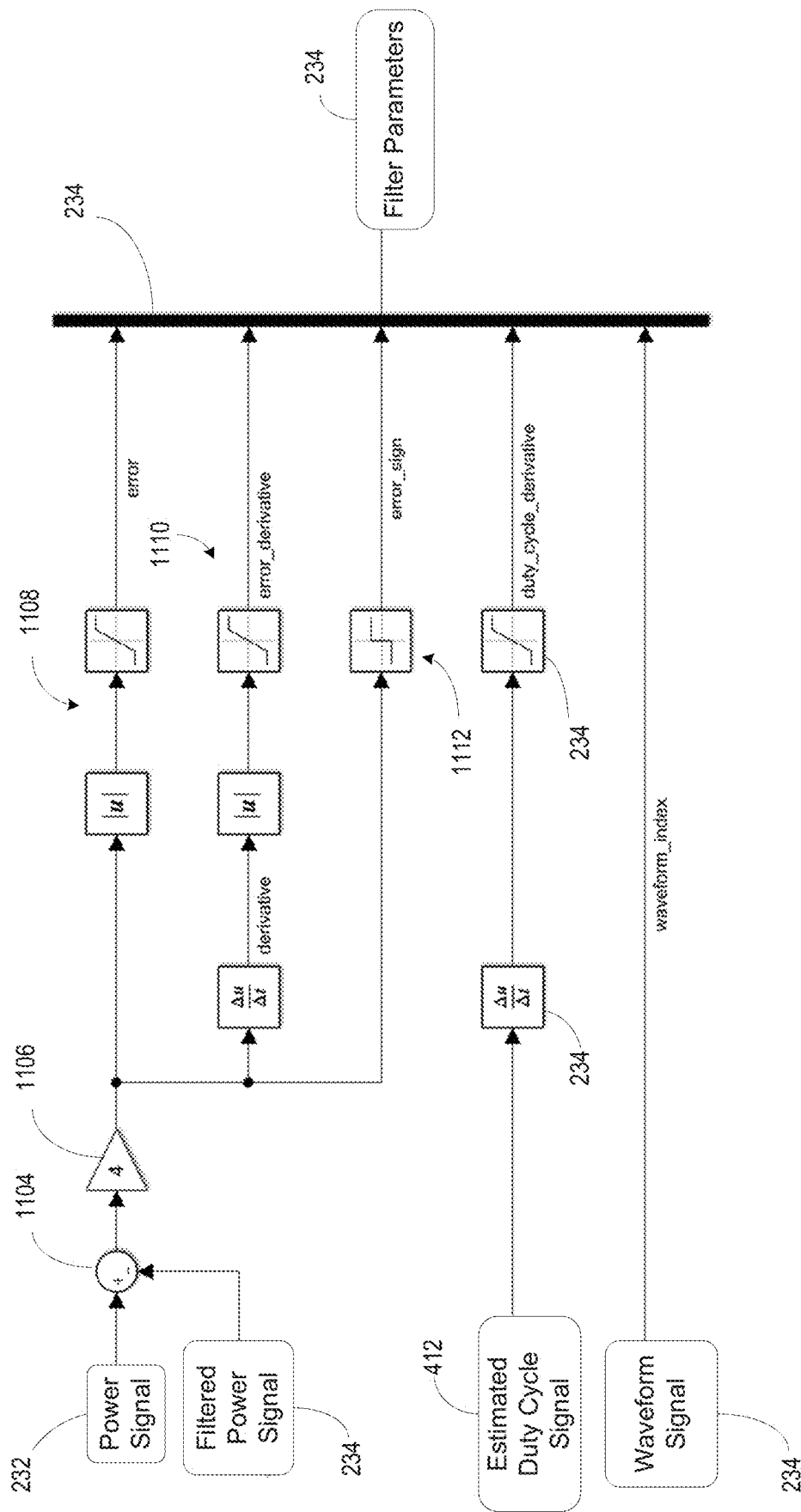
FIG. 11 is a logic diagram of an example of the adaptive active filter parameters circuitry.

In still another example, where the pulse load has a constant waveform, the adaptive filter circuitry 228 may use the running load maximum circuitry 404 to adjust filter parameters such as the time constant of the active filter 402, and use the duty cycle estimator circuitry 406 to adjust filter parameters such as the gain of the active filter 402. In addition, the adaptive active filter parameters controller circuitry 408 may be used to adjust the filter parameters such as the gain to compensate for a variable frequency of the pulse loads 214. In other examples, the pulse load may transition between other types of waveforms, such as step/square, ramp, multi-harmonic sinusoid, staircase, triangular, sawtooth, irregular repeated, and/or any other periodic function waveforms FIG. 11 is a logic diagram of an example of the adaptive active filter parameters circuitry 408. Inputs to the adaptive active filter circuitry 228 include the power signal 232, the filtered power signal 234, the estimated duty cycle 412, and a waveform signal 1102. Referring to FIGS. 2, 4 and 10, a summer 1104 determines a difference signal, which may optionally be conditioned by a conditioner 1106, and be provided to an error circuitry 1108, a derivative circuitry 1110 and a sign circuitry 1112. The error circuitry 1108, derivative circuitry 1110 and sign circuitry 1112 provide an error signal, a derivative of the error signal and a sign error signal, respectively to parameter generation controller circuitry 1114. Parameter generation controller circuitry may generate filter parameter(s) 420 for the active filter 402. The parameter generator controller circuitry 1114 may also selectively use the estimated duty cycle signal 412, the running load maximum signal 410 and the waveform signal according to the variability of the duty cycle, waveform, magnitude and frequency of the pulse load 214 to generate the filter parameters 420. The parameter generation controller circuitry 1114 may receive and analyze the signals to develop the filter parameters to control the active filter 402. In an example, the parameter generator controller circuitry 1114 may use fuzzy logic or some other trainable logic to develop desired outputs of the parameter generator control circuitry. The fuzzy logic may be adaptive and intuitive to a user as the user trains it for a particular response. Other adaptive techniques may also be used such as, for example, Neural Networks, Genetic Algorithms, Machine Learning, and other AI algorithms and/or logic. In an example implementation of a vehicle such as a ship, where there is significant uncertainly in loading as a function of time and the mean value of total load demand can vary greatly with time, the GTEG power management system may be deployed.

The methods, devices, processing, circuitry, and logic described herein may be implemented in many different ways and in many different combinations of hardware and software. For example, all or parts of the implementations may be circuitry that includes an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Accordingly, the circuitry may store or access instructions for execution, or may implement its functionality in hardware alone. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed. For instance, the circuitry may include multiple distinct system components, such as multiple processors and memories, and may span multiple distributed processing systems. Parameters, databases, and other data structures may be separately stored and managed, may be incorporated into a single memory or database, may be logically and physically organized in many different ways, and may be implemented in many different ways. Example implementations include linked lists, program variables, hash tables, arrays, records (e.g., database records), objects, and implicit storage mechanisms. Instructions may form parts (e.g., subroutines or other code sections) of a single program, may form multiple separate programs, may be distributed across multiple memories and processors, and may be implemented in many different ways. Example implementations include stand-alone programs, and as part of a library, such as a shared library like a Dynamic Link Library (DLL). The library, for example, may contain shared data and one or more shared programs that include instructions that perform any of the processing described above or illustrated in the drawings, when executed by the circuitry.

Components of the GTEG power management system described herein may include additional, different, or fewer components. For example, the power on the common bus may be supplied to the load in the absence of the power converter. In addition, the features and functionality of the GTEG power management system described herein may include additional, different, greater or fewer operations than illustrated and/or discussed. In addition, the operations illustrated may be performed in an order different than illustrated.

To clarify the use of and to hereby provide notice to the public, the phrases "at least one of <A>, <B>, . . . and <N>" or "at least one of <A>, <B>, <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

1. A system comprising:
   a generator rotatably driven by a gas turbine engine to output generator electric power to a common bus, the common bus electrically coupled to a variable load comprising a pulse load;
   a source power converter electrically coupled with the common bus;
   an energy source electrically coupled with the source power converter; and
   a controller circuitry configured with an adaptive filter to receive and dynamically filter a power signal indicative of the variable load, the dynamically filtered power signal output as a demand setpoint for the gas turbine engine and generator to supply a part of the pulse load, and a difference between the filtered power signal and the power signal is output by the controller circuitry as a power output setpoint for the source power converter to supply a remainder of the pulse load.

2. The system of aspect 1, wherein the controller circuitry is configured to dynamically adjust the adaptive filter based on the demand setpoint and measured actual power consumption of the variable load.

3. The system as in either of aspect 1 or 2, wherein the controller circuitry is further configured to dynamically adjust the adaptive filter based on a voltage magnitude at the variable load.

4. The system as in any of aspects 1-3, further comprising a power converter electrically coupled between the common bus and the variable load, the power converter configured to convert a voltage of the common bus to a supply voltage of the variable load.

5. The system as in any of aspects 1-4, wherein the controller circuitry is configured to dynamically adjust a gain of the adaptive filter.

6. The system of as in any of aspects 1-5, wherein the controller circuitry is configured to dynamically adjust a gain and a time constant of the adaptive filter.

7. The system as in any of aspects 1-6, wherein the adaptive filter is a low pass filter with an adjustable gain and an adjustable time constant, and the controller circuitry is configured to dynamically adjust the adjustable gain and the adjustable time constant to vary the demand setpoint for the gas turbine engine and the power output setpoint for the source power converter.

8. The system as in any of aspects 1-7, wherein the adaptive filter is dynamically adapted to maintain operation of the gas turbine engine in a predetermined operating range.

9. The system as in any of aspects 1-8, wherein the variable load is a repetitive pulse load, and the controller circuitry is configured to dynamically adjust the adaptive filter to minimize variation in the demand setpoint for the gas turbine engine.

10. The system as in any of aspects 1-9, wherein the energy source is a rechargable battery, a rechargeable capacitor or some combination thereof.

11. A method comprising:
   monitoring a power signal indicative of a load on a common bus, the load comprising a pulse load;
   filtering the power signal with an adaptive filter to generate a filtered power signal;
   identifying a relatively constant part of the power signal;
   dynamically adjusting the adaptive filter in accordance with the identified relatively constant part of the power signal;
   generating a demand setpoint for a gas turbine engine rotatably driving a generator based on the filtered power signal provided by the dynamically adjusted adaptive filter, the gas turbine engine rotatably driving the generator to produce generator output power for a portion of the pulse load in accordance with the demand setpoint;
   generating a power output setpoint for a source power converter in accordance with the filtered power signal provided by the dynamically adjusted adaptive filter; and
   supplying source power to the common bus from a power source via the source power converter, the source power supplied to a remaining portion of the pulse load according to the power output setpoint.

12. The method of aspect 11, wherein dynamically adjusting the adaptive filter comprises adjusting a gain and a time delay of the adaptive filter in accordance with the identified relatively constant part of the power signal.

13. The method of aspect 11 or 12, wherein identifying a relatively constant part of the power signal comprises estimating a duty cycle of the pulse load.

14. The method as in any of aspects 8-13, wherein generating a demand setpoint for the gas turbine engine comprises controlling power demand of a full authority digital electronics control (FADEC) of the gas turbine engine.

15. The method as in any of aspects 8-14, wherein generating the power output setpoint for the source power converter comprises subtracting the filtered power signal from the power signal to generate the power output setpoint.

16. The method as in any of aspects 8-11, wherein dynamically adjusting the adaptive filter comprises adjusting division of the load between the generator and the source power converter.

17. A system comprising:
   an energy source;
   a generator rotatably driven by a gas turbine engine to output generator power to a common bus;
   a source power converter electrically coupled between the energy source and the common bus; and
   a controller circuitry comprising an adaptive filter configured to filter a power signal indicative of power consumption of a variable load on the common bus, and output a filtered signal as a load demand signal to the generator,
   the controller circuitry further configured to output a source demand error signal to control the source power converter to supply power from the energy source to the common bus,
   wherein the source demand error signal is representative of a difference between the filtered signal and power consumption of the dynamic load;
   the controller circuitry further configured to dynamically adjust the adaptive low pass filter in accordance with the power consumption of the dynamic load and the load demand signal of the generator.

18. The system of aspect 17, wherein the controller circuitry is configured to dynamically adjust the adaptive filter by dynamic adjustment of at least one of a time constant and a gain of the adaptive filter.

19. The system of aspect 17 or 18, wherein the controller circuitry includes a running load maximum circuitry configured to dynamically calculate a maximum load value for the variable load, and the controller circuitry further configured to adjust a time constant of the adaptive filter in response to changes in the maximum load value.

20. The system as in any of aspects 17-19, wherein the controller circuitry includes a pulse width estimator circuitry executable to calculate an estimated duty cycle of the variable load, the controller circuitry further configured to adjust at least one of a gain or a time constant of the adaptive filter in accordance with changes in the estimated duty cycle of the variable load.

In addition to the features mentioned in each of the independent aspects enumerated above, some examples may show, alone or in combination, the optional features mentioned in the dependent aspects and/or as disclosed in the description above and shown in the figures.

What is claimed is:
1. A system comprising:
   a generator rotatably driven by a gas turbine engine to output generator electric power to a common bus, the common bus electrically coupled to a variable load comprising a pulse load;
   a source power converter electrically coupled with the common bus;
   an energy source electrically coupled with the source power converter; and
   a controller circuitry configured with an adaptive filter to receive and dynamically filter a power signal indicative of the variable load, the dynamically filtered power signal output as a demand setpoint for the gas turbine engine and generator to supply a part of the pulse load, and a difference between the filtered power signal and the power signal is output by the controller circuitry as a power output setpoint for the source power converter to supply a remainder of the pulse load.

2. The system of claim 1, wherein the controller circuitry is configured to dynamically adjust the adaptive filter based on the demand setpoint and measured actual power consumption of the variable load.

3. The system of claim 1, wherein the controller circuitry is further configured to dynamically adjust the adaptive filter based on a voltage magnitude at the variable load.

4. The system of claim 1, further comprising a power converter electrically coupled between the common bus and the variable load, the power converter configured to convert a voltage of the common bus to a supply voltage of the variable load.

5. The system of claim 1, wherein the controller circuitry is configured to dynamically adjust a gain of the adaptive filter.

6. The system of claim 1, wherein the controller circuitry is configured to dynamically adjust a gain and a time constant of the adaptive filter.

7. The system of claim 1, wherein the adaptive filter is a low pass filter with an adjustable gain and an adjustable time constant, and the controller circuitry is configured to dynamically adjust the adjustable gain and the adjustable time constant to vary the demand setpoint for the gas turbine engine and the power output setpoint for the source power converter.

8. The system of claim 1, wherein the adaptive filter is dynamically adapted to maintain operation of the gas turbine engine in a predetermined operating range.

9. The system of claim 1, wherein the variable load is a repetitive pulse load, and the controller circuitry is configured to dynamically adjust the adaptive filter to minimize variation in the demand setpoint for the gas turbine engine.

10. The system of claim 1, wherein the energy source is a rechargable battery, a rechargeable capacitor or some combination thereof.

11. A method comprising:
monitoring a power signal indicative of a load on a common bus, the load comprising a pulse load;
filtering the power signal with an adaptive filter to generate a filtered power signal;
identifying a relatively constant part of the power signal;
dynamically adjusting the adaptive filter in accordance with the identified relatively constant part of the power signal;
generating a demand setpoint for a gas turbine engine rotatably driving a generator based on the filtered power signal provided by the dynamically adjusted adaptive filter, the gas turbine engine rotatably driving the generator to produce generator output power for a portion of the pulse load in accordance with the demand setpoint;
generating a power output setpoint for a source power converter in accordance with the filtered power signal provided by the dynamically adjusted adaptive filter; and
supplying source power to the common bus from a power source via the source power converter, the source power supplied to a remaining portion of the pulse load according to the power output setpoint.

12. The method of claim 11, wherein dynamically adjusting the adaptive filter comprises adjusting a gain and a time delay of the adaptive filter in accordance with the identified relatively constant part of the power signal.

13. The method of claim 11, wherein identifying a relatively constant part of the power signal comprises estimating a duty cycle of the pulse load.

14. The method of claim 11, wherein generating a demand setpoint for the gas turbine engine comprises controlling power demand of a full authority digital electronics control (FADEC) of the gas turbine engine.

15. The method of claim 11, wherein generating the power output setpoint for the source power converter comprises subtracting the filtered power signal from the power signal to generate the power output setpoint.

16. The method of claim 11, wherein dynamically adjusting the adaptive filter comprises adjusting division of the load between the generator and the source power converter.

17. A system comprising:
an energy source;
a generator rotatably driven by a gas turbine engine to output generator power to a common bus;
a source power converter electrically coupled between the energy source and the common bus; and
a controller circuitry comprising an adaptive filter configured to filter a power signal indicative of power consumption of a variable load on the common bus, and output a filtered signal as a load demand signal to the generator,
the controller circuitry further configured to output a source demand error signal to control the source power converter to supply power from the energy source to the common bus,
wherein the source demand error signal is representative of a difference between the filtered signal and power consumption of the dynamic load;
the controller circuitry further configured to dynamically adjust the adaptive low pass filter in accordance with the power consumption of the dynamic load and the load demand signal of the generator.

18. The system of claim 17, wherein the controller circuitry is configured to dynamically adjust the adaptive filter by dynamic adjustment of at least one of a time constant and a gain of the adaptive filter.

19. The system of claim 17, wherein the controller circuitry includes a running load maximum circuitry configured to dynamically calculate a maximum load value for the variable load, and the controller circuitry further configured to adjust a time constant of the adaptive filter in response to changes in the maximum load value.

20. The system of claim 17, wherein the controller circuitry includes a pulse width estimator circuitry executable to calculate an estimated duty cycle of the variable load, the controller circuitry further configured to adjust at least one of a gain or a time constant of the adaptive filter in accordance with changes in the estimated duty cycle of the variable load.

* * * * *